United States Patent
Yen

(10) Patent No.: US 7,496,022 B2
(45) Date of Patent: *Feb. 24, 2009

(54) METHOD AND APPARATUS OF ADJUSTING PHASE OF A SAMPLING CLOCK AND PREDICTION TIMING OF A SYNCHRONIZATION SIGNAL THROUGH A DISC SIGNAL

(75) Inventor: Kuang-Yu Yen, Tai-Chung (TW)

(73) Assignee: Realtek Semiconductor Corp., HsinChu (TW)

( * ) Notice: Subject to any disclaimer, the term of this patent is extended or adjusted under 35 U.S.C. 154(b) by 588 days.

This patent is subject to a terminal disclaimer.

(21) Appl. No.: 11/160,045

(22) Filed: Jun. 7, 2005

(65) Prior Publication Data

US 2005/0265181 A1    Dec. 1, 2005

Related U.S. Application Data

(63) Continuation-in-part of application No. 10/908,823, filed on May 27, 2005.

(30) Foreign Application Priority Data

Jun. 8, 2004    (TW) .............................. 93116429 A

(51) Int. Cl.
    *G11B 7/00* (2006.01)
(52) U.S. Cl. ................... 369/59.19; 369/47.48
(58) Field of Classification Search ........... None
    See application file for complete search history.

(56) References Cited

U.S. PATENT DOCUMENTS

| | | | |
|---|---|---|---|
| 4,747,116 A | 5/1988 | Yajima | |
| 6,084,731 A | 7/2000 | Uchida | |
| 6,496,555 B1 * | 12/2002 | Soda | ............ 375/376 |
| 6,532,128 B1 | 3/2003 | Bui | |
| 6,536,011 B1 | 3/2003 | Jang | |
| 6,697,383 B1 | 2/2004 | Li | |
| 6,895,062 B1 * | 5/2005 | Wilson | ............ 375/355 |
| 7,193,940 B2 | 3/2007 | Chen | |

(Continued)

FOREIGN PATENT DOCUMENTS

EP    0902426 A1    3/1999

(Continued)

OTHER PUBLICATIONS

JP 2001-036511, Naoe Hitoshi, Sep. 2001, Bit Synchronization circuit (English translation whole document).*

*Primary Examiner*—Wayne R Young
*Assistant Examiner*—Van N Chow
(74) *Attorney, Agent, or Firm*—Winston Hsu

(57) ABSTRACT

A detection apparatus of an optical storage device for detecting a synchronization signal includes a sampling module for sampling a disc signal to generate a plurality of sampled data, a comparing module coupled to the sampling module for comparing the sampled data and a synchronization pattern to generate a first compared result and to generate a second comparing result after a time interval, and an adjusting module coupled to the comparing module for gathering a statistic of the first and the second comparing results to generate an adjusting signal for adjusting a phase of the sampling clock.

20 Claims, 7 Drawing Sheets

U.S. PATENT DOCUMENTS

| | | | |
|---|---|---|---|
| 2003/0002419 A1* | 1/2003 | Kuma et al. | 369/59.22 |
| 2004/0258185 A1* | 12/2004 | Kihara | 375/371 |
| 2005/0069041 A1* | 3/2005 | Lincoln | 375/257 |
| 2005/0141384 A1* | 6/2005 | Lee et al. | 369/59.19 |

FOREIGN PATENT DOCUMENTS

| | | |
|---|---|---|
| TW | 498206 | 8/2002 |
| TW | 561461 | 11/2003 |
| TW | 574786 | 2/2004 |
| WO | 9814936 | 4/1998 |

\* cited by examiner

METHOD AND APPARATUS OF ADJUSTING PHASE OF A SAMPLING CLOCK AND PREDICTION TIMING OF A SYNCHRONIZATION SIGNAL THROUGH A DISC SIGNAL

CROSS REFERENCE TO RELATED APPLICATIONS

This is a continuation-in-part of U.S. application Ser. No. 10/908,823, filed in 27$^{th}$, May, 2005, which is incorporated herein by reference.

BACKGROUND OF THE INVENTION

1. Field of the Invention

The invention relates to optical storage devices, and more particularly, to a method and an apparatus of adjusting a sampling phase of the disc signal.

2. Description of the Prior Art

In communication systems, the transmitter utilizes a synchronization pattern in order to align each frame and transfer data. The receiver searches the synchronization pattern when receiving signals and to decode data following after the synchronization pattern. For example, the synchronization pattern of a digital versatile disc (DVD) is a series of 14 signals, whose logic level are all 1. When decoding the DVD signals, the DVD displayer continuously compares the DVD signals with the 14 logic-level-1 signals to search for the synchronization pattern in the DVD signals and decode the following data after the synchronous pattern.

In communication systems, the receiver utilizes a sampling clock to sample the analog signal, and utilizes a signal level to transform the sampling clock into a digital signal for following digital signal process. However, signal jitter causes the sampling signal not to sample the analog signal according to an ideal timing so that the sampling value of the sampling signal diverges from the ideal value. That is, the bit error rate of the communication system rises. When the signal jitter drives the sampling clock to sample at an incorrect timing (that is, the phase of the sampling clock shifts), the sampling signal is determined as an incorrect signal level so that the synchronization signal of the disc signal is impacted or the following decoding procedure of the disc signal is impacted. Furthermore, the disc signal may not be decoded smoothly and correctly.

SUMMARY OF THE INVENTION

It is therefore one objective of the claimed invention to provide a method or an apparatus of adjusting the phase of the sampling clock and/or prediction timing of a synchronization signal through the disc signal.

According to the claimed invention, a detection method comprises: utilizing a sampling clock to sample a disc signal to generate a plurality of sampled data; comparing the sampled data with a synchronization pattern to generate a first compared result and at a specified interval to generate a second compared result after a time interval; and adjusting the timing of the sampling clock according to a statistical result generated from the compared results.

Furthermore, the detection device comprises: a sampling module for utilizing a sampling clock to sample a disc signal for generating a plurality of sampled data; a comparing module for comparing the sampled data and a synchronization pattern to generate a first compared result and to generate a second comparing result after a time interval; and an adjusting module for gathering a statistic of the comparing results to generate an adjusting signal for adjusting a phase of the sampling clock.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
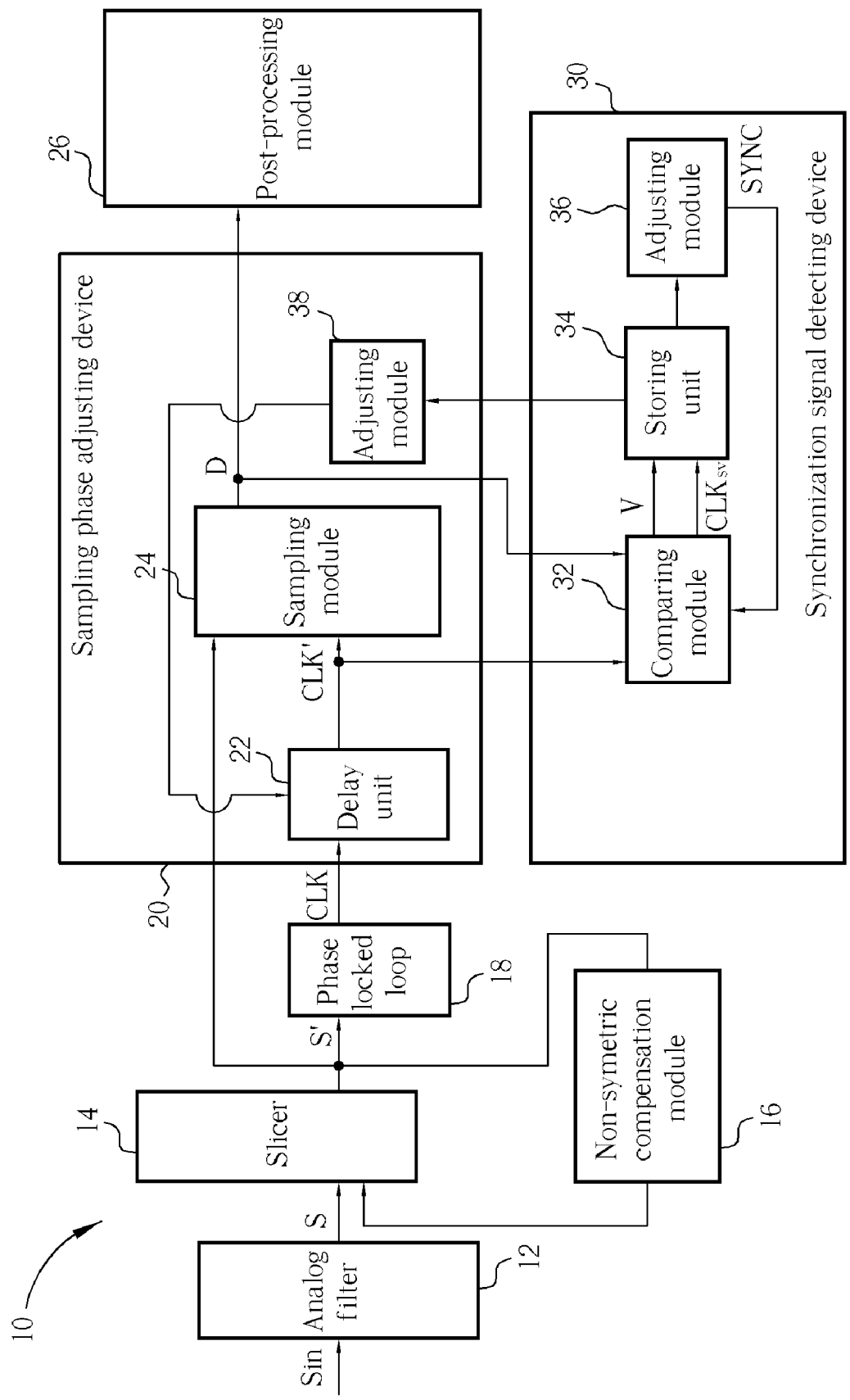
FIG. 1 is a diagram of a sampling phase adjusting device and a synchronization signal detection device utilized in an optical disc drive according to the present invention.

FIG. 1 is a diagram of a phase adjusting device 20 and a synchronization signal detection device 30 utilized in an optical disc drive 10 according to the invention. The optical disc drive 10 receives an input signal Sin (eg., an eight-to-fourteen modulation (EFM) signal from an optical disc). The analog filter 12 filters the input signal Sin to generate a filtered signal S. The slicer 14 transforms the filtered signal into a corresponding sliced signal S' according to a slice level. Furthermore, non-symmetric compensating module 16 forms a feedback loop for moving out the DC offset of the sliced signal S'. That is, the DC offset is moved out by adjusting the slice level of the slicer 14. In addition, the phase-locked-loop (PLL) 18 generates a sampling clock CLK according to the sliced signal S'. The phase adjusting device 20 adjusts a phase of the sampling clock CLK to sample the sliced signal S', and comprises a delay unit 22, a sampling module 24, and an adjusting module 38. The synchronization signal detection device 30 detects a synchronization signal of the input signal Sin, and comprises a comparing module 32, a storage unit 34, and an adjusting module 36. In this embodiment, the sampling module 24 utilizes an adjusted sampling clock CLK' to sample the sliced signal S' in order to generate sampled data D. The post-processing module 26 executes additional processing on the sampled data D.

Figure 2:
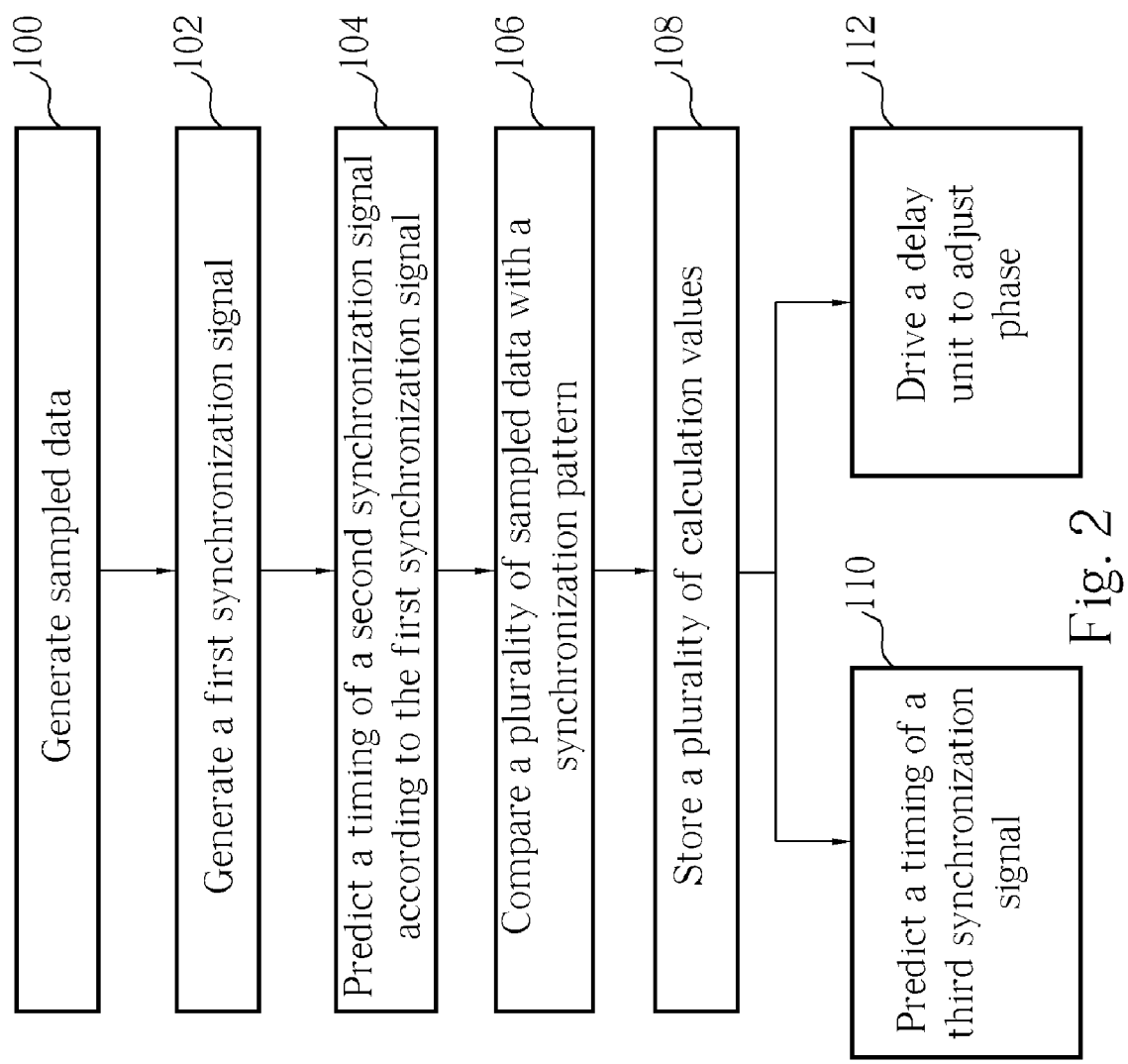
FIG. 2 is an operational flow chart of the sampling phase adjusting device and the synchronization detection device shown in FIG. 1.
Figure 3:
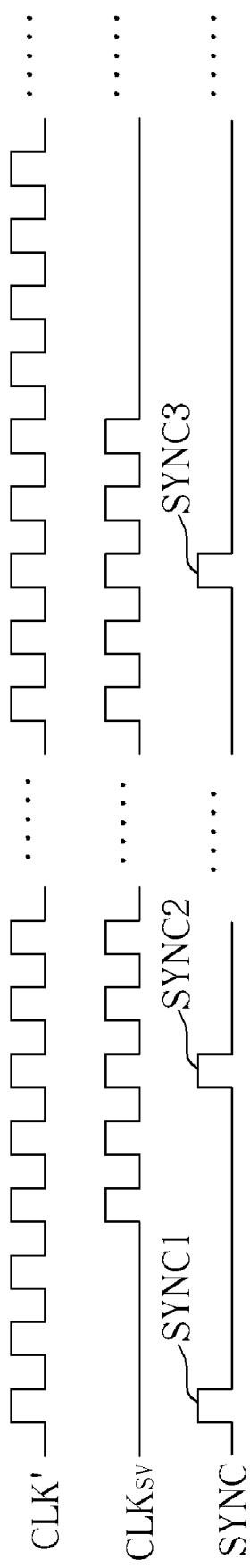
FIG. 3 is a timing diagram of the sampling clock, the storage clock, and the synchronization signal shown in FIG. 1.

Please refer to FIG. 2 and FIG. 3. The operation is illustrated as follows:

Step 100: The sampling module 24 continuously samples the sliced signal S' using the adjusted sampling clock CLK' to orderly generate a plurality of sampled data D.

Step 102: The comparing module 32 compares the sampled data D with a known synchronization pattern to generate a first synchronization signal SYNC1.

Step 104: The comparing module 32 predicts a timing of a next synchronization signal SYNC2 according to the first synchronization signal SYNC1. The preferred embodiment is utilized in a DVD system; therefore, the interval of two synchronization signals is 1488 cycles. In addition, it is easily seen that the timing of the synchronization signal SYNC2 comes 1488 cycles after the timing of the synchronization signal SYNC1.

Step 106: Before the predicted timing of the second synchronization signal SYNC2, the comparing module 32 compares the sampled data corresponding to the comparing timing with the synchronization pattern to generate a plurality of calculation values V. In this embodiment, the comparing module 32 compares the sampled data D with the synchronization pattern from 2 cycles before the timing of the synchronization signal SYNC2, and triggers the storing clock CLKsv. That is, the comparing module 32 compares the sampled data D with the synchronization pattern between 2 cycles before the timing of the synchronization signal SYNC2 and 2 cycles after the timing of the synchronization signal SYNC2 to respectively calculate 5 calculation values V.

Step 108: The storage unit 34 stores the calculation values V according to a storing clock CLKsv. In this embodiment, the 5 calculation values V are stored in the storage unit 34. In this embodiment, the calculation value V is calculated by executing correlation arithmetic on the sampled data D and the predetermined synchronization pattern. This also means that the calculation value V represents the similarity between the sampled data D and the synchronization pattern.

Step 110: The adjusting module 36 predicts a timing of a third synchronization signal according to the calculation values V stored in the storage unit 34.

Step 112: The adjusting module 36 utilizes the calculation values V stored in the storage unit 34 to drive the delay unit 22 for adjusting the phase of the adjusted sampling clock CLK'.

Figure 4:
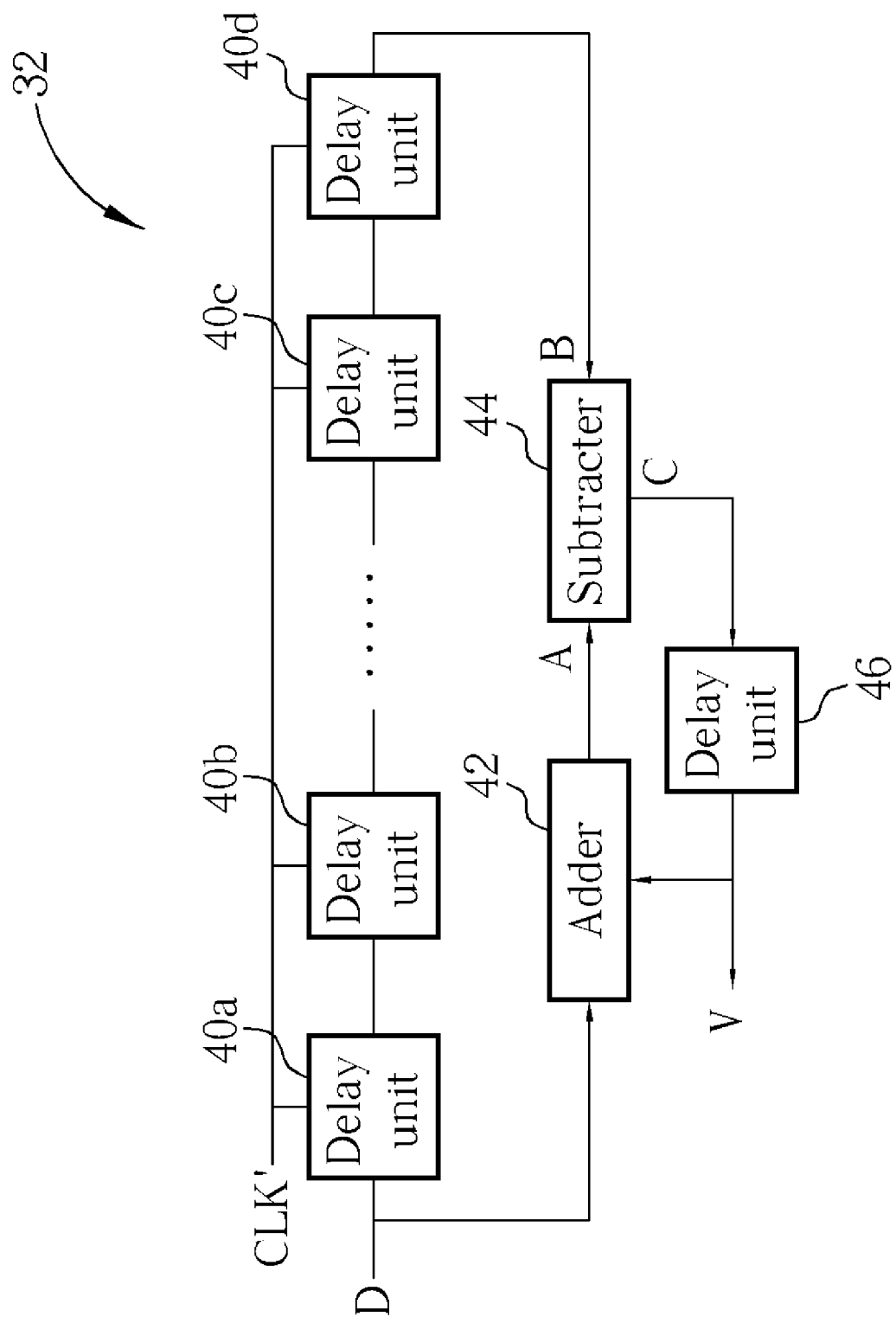
FIG. 4 is a block diagram of the comparing module shown in FIG. 1.

FIG. 4 is a block diagram of the comparing module 32 shown in FIG. 1. The comparing module 32 comprises serially-coupled delay units 40a, 40b, 40c, and 40d, an adder 42, a subtractor 44, and a delay unit 46. In this embodiment, the input signal Sin is a signal which conforms to the DVD standard. Therefore, the comparing module 32 utilizes 14 serially-coupled delay units 40 to compare the synchronization pattern having 14 continuous logic values 1. Additionally, the comparing module 32 executes correlation arithmetic on the synchronization pattern having 14 continuous logic values 1 to calculate a correlation value (the calculation value V). The sampled data D is orderly inputted into the comparing module 32. In the following, assuming that the delay units 40a, 40b, 40c, 40d, and 46 all have an initial value 0, when a sampled data $D_1$ is inputted into the delay unit 40a, the delay unit 40a keeps the sampled data $D_1$. Furthermore, the output data A of the adder 42 is the sampled data $D_1$, and the output data C of the subtractor 44 is also sampled data $D_1$. When next sampled data $D_2$ is inputted into a delay unit 40a, the delay unit 40a transfers the original sampled data $D_1$ to the delay unit 40b and then keeps the sampled data $D_2$. This also means that the delay units 40a and 40b keep the sampled data $D_2$ and $D_1$, respectively. Furthermore, because the delay unit currently keeps the sampled data $D_1$, the output data A of the adder 42 is the sum of the sampled data $D_1$ and $D_2$, and the output data C of the subtractor 44 is also the sum of the sampled data $D_1$ and $D_2$. Therefore, the delay unit 46 updates the stored value to be the sum of the sampled data $D_1$ and $D_2$. Furthermore, when the above-mentioned 14 sampled data $D_1$-$D_{14}$ are all inputted into the comparing module 32, the delay units 40a, 40b, 40c, 40d respectively store the sampled data $D_{14}$, $D_{13}$, $D_2$, $D_1$, and the delay unit 46 stores the sum of all sampled data $D_1$-$D_{14}$. When the next sampled data $D_{15}$ is inputted into the comparing module 32, the output data A of the adder 42 is the sum of the sampled data $D_1$-$D_{15}$, and the delay unit 40d keeps the sampled data $D_2$ and outputs the original sampled data $D_1$ (the output data B). Therefore, the output data C of the subtractor 44 becomes the sum of the sampled data $D_2$-$D_{15}$ so that the stored value (the calculation value V) in the delay unit 46 is further updated. Please note that the delay units 40a, 40b, 40c, 40d shown in FIG. 4 eventually store the sampled data $D_{15}$, $D_{14}$, $D_3$, $D_2$. Therefore, for every 14 sampled data, the comparing module 32 can calculate the calculation value V corresponding to the time interval of the 14 sampled data.

Figure 5:
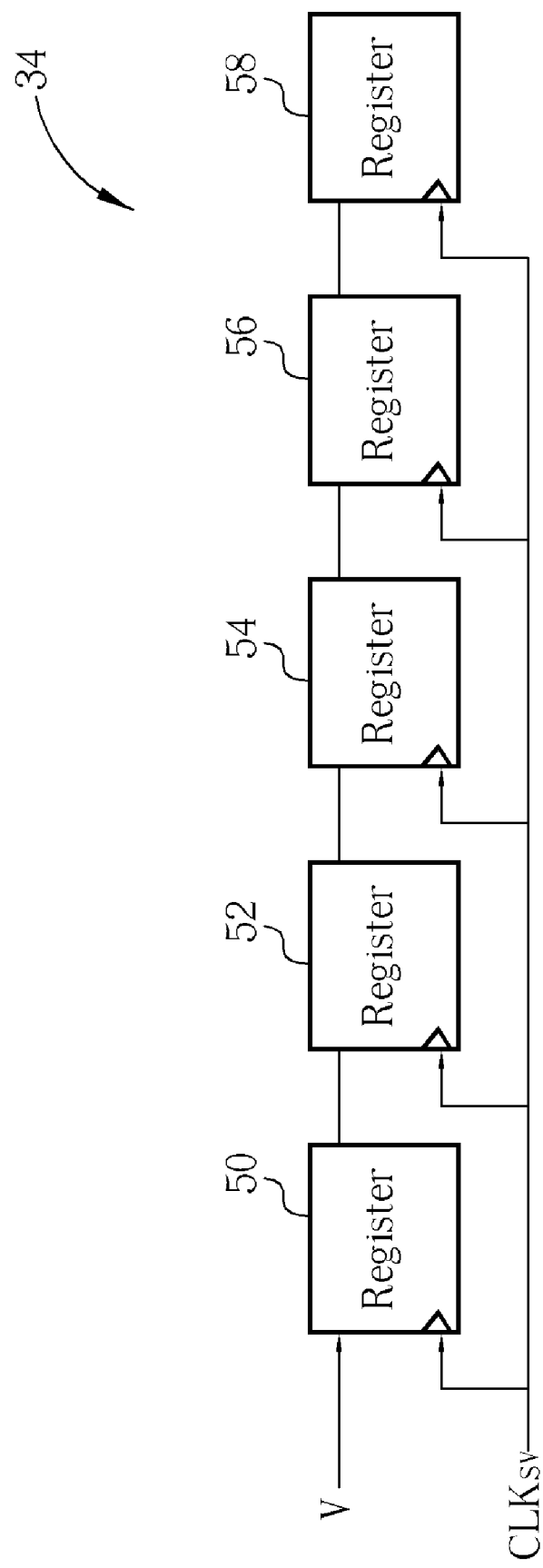
FIG. 5 is a diagram of the storage unit shown in FIG. 1.
Figure 6:
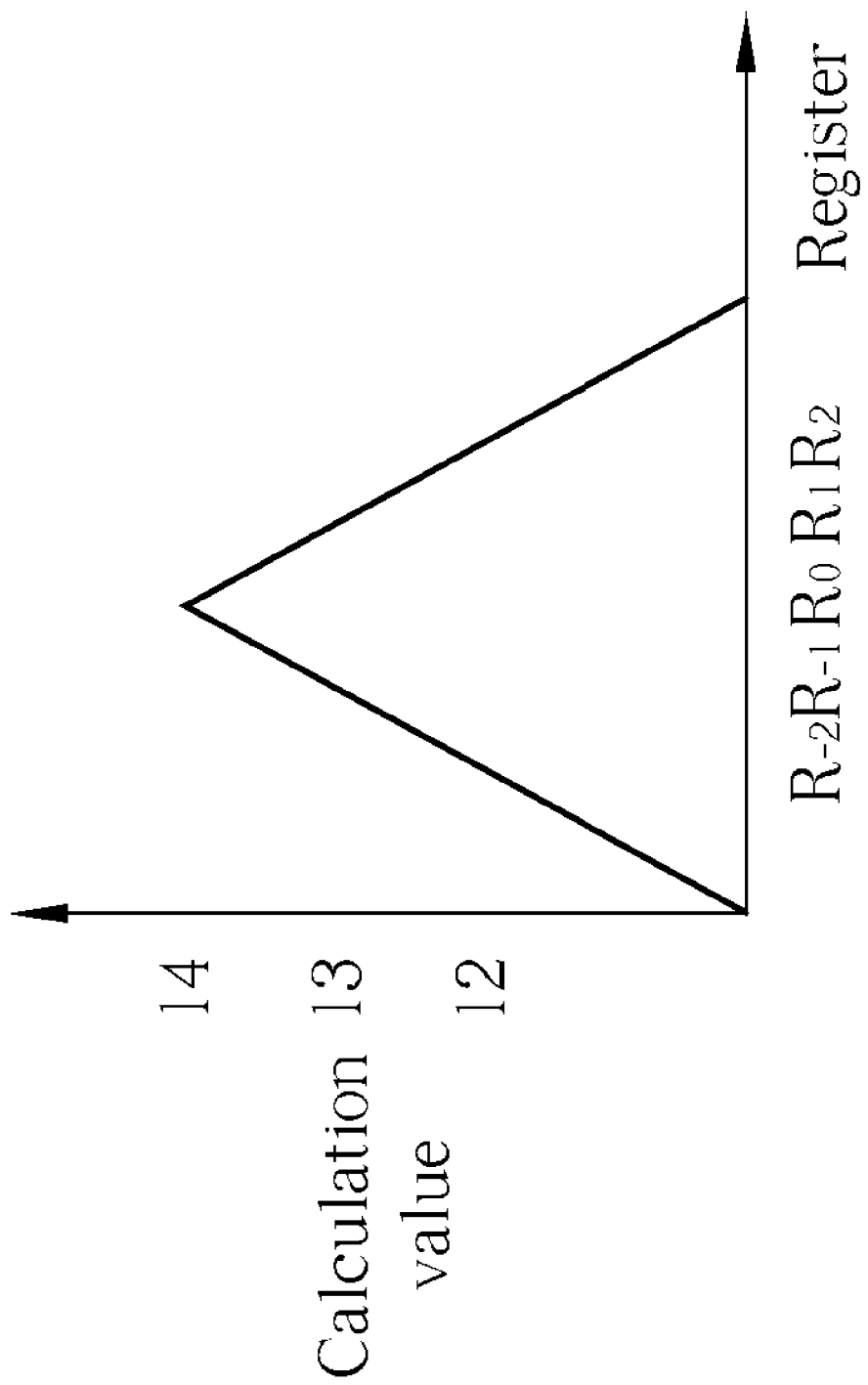
FIG. 6 is a diagram of registers shown in FIG. 5 and corresponding calculation values.

FIG. 5 is a diagram of the storage unit 34 shown in FIG. 1. The storage unit 34 comprises registers 50, 52, 54, 56, 58, which are used for respectively storing the five calculation values V. The calculation values V are calculated in order by the comparing module 32, according to the storing clock CLKsv. Here, the starting timing of the comparing time corresponding to the register 54 is a median value of a plurality of starting timing of the comparing time corresponding to the registers 50, 52, 54, 56, and 58. Please refer to FIG. 5 and FIG. 6. For ease of illustration, five marks $R_{-2}$, $R_{-1}$, $R_0$, $R_1$, and $R_2$ are respectively used on the horizontal axis to represent the above-mentioned registers 50, 52, 54, 56, and 58. Additionally, the vertical axis represents the calculation values V (or called as correlation value in this invention) stored in the registers 50, 52, 54, 56, and 58. For example, in an ideal operation, the calculation value of the comparing module 32 is 12 at 2 cycles before the predetermined timing of the synchronization signal SYNC2. Additionally, the calculation value (12) is stored in the register 50. At 1 cycle before the predetermined timing of the synchronization signal SYNC2, the calculation value of 13 is stored in the register 52. Similarly, at the predetermined timing of the synchronization signal SYNC2, the calculation value of 14 is stored in the register 54. Similarly, at 1 cycle after the predetermined timing of the synchronization signal SYNC2, the calculation value of 13 is stored in the register 56. Additionally, at 2 cycles after the predetermined timing of the synchronization signal SYNC2, the calculation value of 12 is stored in the register 58.

In this embodiment, the adjusting module 36 utilizes the calculation values V stored in the registers 50, 52, 54, 56, and 58 to predict and adjust the timing of the next synchronization signal SYNC3. If the timing of the synchronization signal SYNC2 can be correctly predicted according to the synchronization signal, the register 54 stores the largest calculation value among the registers 50, 52, 54, 56, and 58. If the largest calculation value is not stored in the register 54, a shift value between the register having the biggest calculation value and the register 54 is utilized to determine a timing offset of the current synchronization signal SYNC2, and further utilized to adjust the predicted timing of the next synchronization signal SYNC3. For example, if the biggest calculation value is stored in the register 56 (for example, when the synchronization signal SYNC1 is used to predict the timing of the synchronization signal SYNC2, the predicted timing of the synchronization signal SYNC2 is 1 cycle later than the real timing of the synchronization signal SYNC2), therefore, when the predicted timing of the synchronization signal SYNC2 is utilized to predict the timing of the synchronization signal SYNC3, one cycle should be advanced to correctly predict the timing of the synchronization signal SYNC3. This also means that after 1487 cycles from the predicted timing of the synchronization signal SYNC2, the next triggered timing of the next cycle is the timing of the synchronization signal SYNC3. Furthermore, if the largest calculation value is stored in the register 50 (for example, when the synchronization signal SYNC1 is utilized to predict the timing of the synchronization signal SYNC2, the predicted timing of synchronization signal SYNC2 is 2 cycles early than the real timing of the synchronization signal SYNC2), therefore, when the predicted timing of the synchronization signal SYNC2 is used to predict the timing of the synchronization signal SYNC3, 2 sampling clock cycles have to be delayed. That is, after 1490 sampling clock cycles from the predicted timing of the synchronization signal SYNC2, the next triggered timing of the next cycle is the timing of the synchronization signal SYNC3. In this way, the adjusting module 38 can utilize the calculation values according to the 5 comparing timings to adjust the predicted timing of the next synchronization signal.

Figure 7:
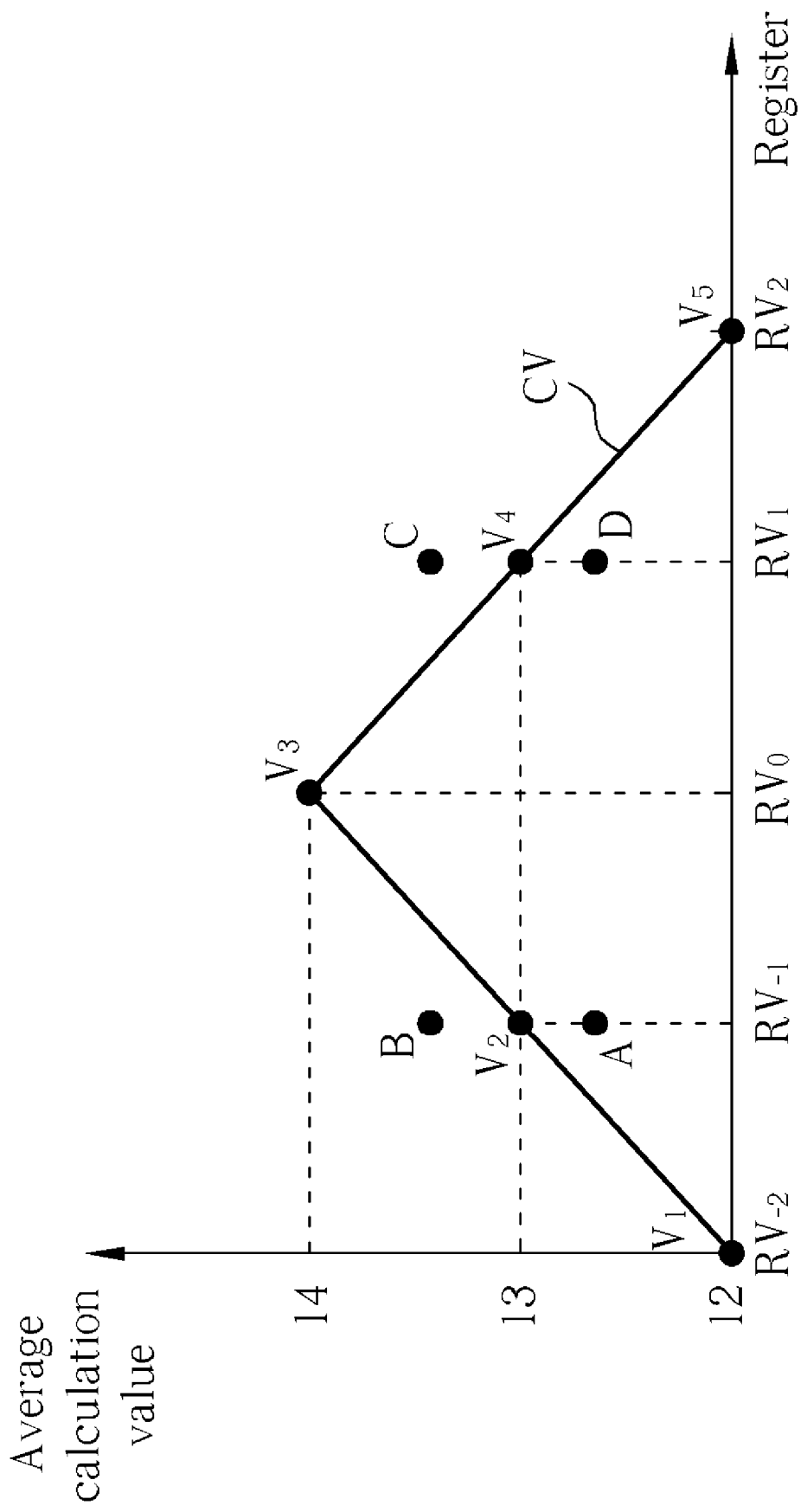
FIG. 7 is a diagram of an average calculation value generated by the adjusting module of the sampling phase adjusting device shown in FIG. 1.

In this embodiment, the adjusting module 38 also utilizes the calculation values V stored in the registers 50, 52, 54, 56, and 58 to drive the delay unit 22 for adjusting the phase of the adjusted sampling clock CLK'. Please refer to FIG. 7, which is a diagram of an average calculation value generated by the adjusting module 38 of the phase adjusting device 20 shown in FIG. 1. The horizontal axis represents the registers $RV_{-2}$, $RV_{-1}$, $RV_0$, $RV_1$, $RV_2$, which are used for storing the average calculation value, and the vertical axis represents the average calculation value. The registers $RV_{-2}$, $RV_{-1}$, $RV_0$, $RV_1$, $RV_2$ corresponds to the registers 50, 52, 54, 56, 58 of the storage unit 34, respectively. Furthermore, each register $RV_{-2}$, $RV_{-1}$, $RV_0$, $RV_1$, $RV_2$ is used to store an average value of the calculation values V outputted by the corresponding registers 50, 52, 54, 56, 58. In other words, the adjusting module 36 continuously calculates a new average value according to the received calculation values V in order to update the original average value. In an ideal situation, when the adjusted sampling clock CLK' does not have significant jitter, the average calculation values $V_1$, $V_2$, $V_3$, $V_4$, $V_5$ stored in the registers $RV_{-2}$, $RV_{-1}$, $RV_0$, $RV_1$, $RV_2$ correspond to the characteristic curve CV shown in FIG. 7. That is, two registers (such as $RV_{-1}$ and $RV_1$, or $RV_{-2}$ and $RV_2$) symmetric to the central register $RV_0$ theoretically have the same average calculation value. However, when the adjusted sampling clock CLK' samples earlier because of jitter, the average calculation value stored in the register $RV_{-1}$ is between 12 and 13 (as shown by mark A in FIG. 6), and the average calculation value stored in the register $RV_1$ is between 13 and 14 (as shown by mark C in FIG. 6). Therefore, if the average calculation value stored in the register $RV_1$ is larger than the average calculation value stored in the register $RV_{-1}$, the adjusting module 36 drives the delay unit 22 to delay the adjusted sampling clock CLK' to sample the disc signal. On the other hand, when the adjusted sampling clock CLK' is delayed because of jitter, the average calculation value stored in the register $RV_{-1}$ is between 13 and 14 (as the mark B shown in FIG. 6), and the average calculation value stored in the register $RV_1$ is between 12 and 13 (as the mark D shown in FIG. 6). Therefore, if the average calculation value stored in the register $RV_{-1}$ is larger than the average calculation value stored in the register $RV_1$, the adjusting module 36 drives the delay unit 22 to make the adjusted sampling clock CLK' sample the disc signal earlier. Finally, the sampling module 24 utilizes the adjusted sampling clock CLK' to sample the slicing signal S' in order to generate sampled data, and then the post-processing module 26 post-processes the sampled data (such as demodulation or digital signal processing).

As mentioned above, the adjusting module 36 utilizes a maximum calculation value stored in the register 50, 52, 54, 56, 58 to adjust the predicted timing of the next synchronization signal. Because the calculation values are symmetric, the calculation values stored in the symmetric registers can also be used to determine the predicted timing. That is, in an ideal situation, symmetric registers (register 52 and register 56) theoretically have the same calculation value. When the maximum calculation value is stored in the register 56 and the calculation value of the register is 12, a shift value can be calculated by subtracting the maximum calculation value and the calculation value of the register 52, where the shift value is used to represent that the predicted timing of the synchronization signal SYNC2 has to be delayed to meet the real timing. Therefore, the timing of the next synchronization signal SYNC3 is also predicted according to the shift value. Furthermore, the calculation values stored in symmetric registers can be used to check if the sampling phase of the disc signal is correct, and used to further drive the delay unit 22 to adjust the phase of the adjusted sampling clock CLK'.

In this invention, the synchronization signal is not detected through comparing all sampled data. The invention only compares several cycles to determine a shift value, and utilizes the shift value to adjust the timing of the next synchronization. Therefore, if an optical disc is partially damaged, the present invention can quickly determine a correct synchronization signal so that the power consumption is reduced. Furthermore, adjusting the phase of the adjusted clock according to this invention so that bit error rate due to jitter is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for generating a sampling clock in an optical storage device, comprising:
    sampling a disc signal with a sampling clock to generate a plurality of sampled data;
    comparing the sampled data with a predetermined synchronization pattern to determine a time of a first synchronization pattern occurring in the sampled data;
    determining a time of a second synchronization pattern occurring in the sampled data according to a predetermined interval after the time of the first synchronization pattern;
    comparing the plurality of sampled data with the predetermined synchronization pattern within a range around the time of the second synchronization pattern to thereby generate a plurality of respective computation values;
    determining whether the time of the second synchronization pattern is correct according to the computation values; and
    adjusting the phase of the sampling clock according to the computation values when the time of the second synchronization pattern is not correct.

2. The method of claim 1, wherein the predetermined synchronization pattern comprises fourteen successive logical values "1".

3. The method of claim 1 wherein the predetermined interval is substantially equal to the time needed for generating the sampled data corresponding to a frame.

4. The method of claim 1, wherein the predetermined time interval corresponds to 1488 cycles of the sampling clock.

5. The method of claim 1, wherein the step of generating the computation values comprises:
    calculating a computation value for each of the sampling clocks within the range around the time of the second synchronization pattern, each computation value representing a similarity between the sampled data and the predetermined synchronization pattern.

6. The method of claim 5, further comprising adjusting the phase of the sampling clock according to a symmetry of average computation values around a center computation value.

7. The method of claim 6, further comprising shifting the phase of the sampling when an average value of a first computation value on a first side of the center computation value is different than an average value of a second computation value on a second side of the center computation value.

8. The method of claim 7, wherein shifting the phase involves delaying the phase of the sampling clock.

9. The method of claim 7, wherein shifting the phase involves advancing the phase of the sampling clock.

10. The method of claim 1, wherein the disc is a optical disc.

11. A phase adjusting device for generating a sampling clock in an optical storage device, comprising:

a sampling module for sampling a disc signal with a sampling clock to generate a plurality of sampled data;

a comparing module electrically coupled to the sampling module for comparing the sampled data with a predetermined synchronization pattern to determine a time of a first synchronization pattern occurring in the sampled data, determining a time of a second synchronization pattern occurring in the sampled data according to a predetermined interval after the time of the first synchronization pattern, and for comparing the plurality of sampled data with the predetermined synchronization pattern within a range around the time of the second synchronization pattern to thereby generate a plurality of respective computation values; and an adjusting module electrically coupled to the comparing module for determining whether the time of the second synchronization pattern is correct according to the computation values, and adjusting the phase of the sampling clock according to the computation values when the time of the second synchronization pattern is not correct.

12. The device of claim 11, wherein the predetermined synchronization pattern comprises fourteen successive logical values "1".

13. The device of claim 11 wherein the predetermined interval is substantially equal to the time needed for generating the sampled data corresponding to a frame.

14. The device of claim 11, wherein the predetermined time interval corresponds to 1488 cycles of the sampling clock.

15. The device of claim 11, wherein the comparing module is further for calculating a computation value for each of the sampling clocks within the range around the time of the second synchronization pattern, each computation value representing a similarity between the sampled data and the predetermined synchronization pattern.

16. The device of claim 15, wherein the adjusting module is further for adjusting the phase of the sampling clock according to a symmetry of average computation values around a center computation value.

17. The device of claim 16, wherein the adjusting module is further for shifting the phase of the sampling when an average value of a first computation value on a first side of the center computation value is different than an average value of a second computation value on a second side of the center computation value.

18. The device of claim 17, wherein the adjusting module is for shifting the phase by delaying the phase of the sampling clock.

19. The device of claim 17, wherein the adjusting module is for shifting the phase by advancing the phase of the sampling clock.

20. The device of claim 11, wherein the disc is an optical disc.

* * * * *